(12) United States Patent
Tada et al.

(10) Patent No.: US 9,536,907 B2
(45) Date of Patent: Jan. 3, 2017

(54) THIN FILM SEMICONDUCTOR DEVICE

(71) Applicant: Japan Display Inc., Minato-ku (JP)

(72) Inventors: Masahiro Tada, Minato-ku (JP); Takashi Nakamura, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/734,253

(22) Filed: Jun. 9, 2015

(65) Prior Publication Data
US 2016/0005880 A1 Jan. 7, 2016

(30) Foreign Application Priority Data

Jun. 23, 2014 (JP) ................................. 2014-128377

(51) Int. Cl.
*H01L 29/786* (2006.01)
*H01L 27/12* (2006.01)

(52) U.S. Cl.
CPC ....... *H01L 27/124* (2013.01); *H01L 29/78633* (2013.01); *H01L 29/78645* (2013.01); *H01L 29/78609* (2013.01); *H01L 29/78675* (2013.01)

(58) Field of Classification Search
CPC .................... H01L 29/78609; H01L 29/78633; H01L 27/124; H01L 29/78675
See application file for complete search history.

(56) References Cited

U.S. PATENT DOCUMENTS

| 2004/0257489 | A1* | 12/2004 | Gotoh | G02F 1/136209 349/44 |
| 2009/0065783 | A1* | 3/2009 | Moriwaki | G02F 1/136209 257/72 |
| 2010/0072503 | A1* | 3/2010 | Nakagawa | H01L 29/42384 257/98 |
| 2011/0024763 | A1 | 2/2011 | Noda et al. | |

FOREIGN PATENT DOCUMENTS

| JP | 11-126904 | 5/1999 |
| JP | 2011-33703 | 2/2011 |

* cited by examiner

*Primary Examiner* — Peniel M Gumedzoe
(74) *Attorney, Agent, or Firm* — Oblon, McClelland, Maier & Neustadt, L.L.P.

(57) ABSTRACT

According to one embodiment, provided is a thin film transistor with which it is possible to reduce the leakage current and thereby, for a liquid crystal display device, to ensure a good display quality. The thin film transistor includes a semiconductor layer, gate electrodes, first light-blocking electrodes, and second light-blocking electrodes. The first light-blocking electrodes are disposed opposite to the gate electrodes with respect to the semiconductor layer and opposed to channel regions to block light incident into the channel regions. The second light-blocking electrodes are disposed opposite to the semiconductor layer with respect to the gate electrodes, arranged to block light incident into the channel regions, and electrically connected with one of a signal line and a pixel electrode.

5 Claims, 7 Drawing Sheets

THIN FILM SEMICONDUCTOR DEVICE

INCORPORATION BY REFERENCE

The present invention claims priority under 35 U.S.C. §119 to Japanese Patent Application No. 2014-128377 filed on Jun. 23, 2014. The content of the application is incorporated herein by reference in its entirety.

FIELD

An embodiment of the present invention relates to a thin film semiconductor device arranged to drive a pixel electrode, with which an image is displayed, according to a signal voltage applied on a signal line.

BACKGROUND

In various mobile terminals such as cell-phones, smartphones, and tablet PCs, television receivers, or personal computers, liquid crystal displays (LCDs) have recently been frequently used as flat panel displays (FPDs) utilizing such characteristics as lightweight, thinned form, and low power consumption. In such liquid crystal displays, a liquid crystal layer is provided between a pair of substrates and thin film transistors each employing a low-temperature polysilicon semiconductor layer (LTPS-TFTs) are formed in a matrix as switching elements arranged to drive the liquid crystal layer.

In the case of using such a liquid crystal display for, in particular, a mobile terminal, there has been a need for a technique for intermittently driving the thin film transistors at low frequency when displaying a still image, for example, to reduce the drain on battery power more reliably for lower power consumption. Thus intermittently driving the thin film transistors suffers from a problem of leakage current when the thin film transistors are off. That is, it is necessary to hold the potential of each pixel electrode to maintain the image quality, whereas if the leakage current is large, charges may transfer from the pixel electrode to the signal line, so that the potential of the pixel electrode may vary (the voltage of the pixel electrode may fluctuate) and flickering may appear.

DETAILED DESCRIPTION

Embodiments provide a thin film semiconductor device for use in a display device, the thin film semiconductor device arranged to drive a pixel electrode, with which an image is displayed, according to a signal voltage applied on a signal line. The thin film semiconductor device includes a semiconductor layer, a gate electrode, and a light-blocking electrode. The semiconductor layer includes a channel region and a pair of contact regions disposed with the channel region therebetween. The pair of contact regions are doped with an impurity at a concentration relatively higher than in the channel region, one of the contact regions electrically connected to the signal line, while the other electrically connected to the pixel electrode. The gate electrode is disposed at a position opposed to the channel region of the semiconductor layer. The light-blocking electrode is arranged to block light incident into the channel region. The light-blocking electrode consists of a first light-blocking electrode and a second light-blocking electrode. The first light-blocking electrode is disposed opposite to the gate electrode with respect to the semiconductor layer and opposed to the channel region to block light incident into the channel region. The second light-blocking electrode is disposed opposite to the semiconductor layer with respect to the gate electrode, arranged to block light incident into the channel region, and electrically connected with one of the signal line and the pixel electrode.

An arrangement according to a first embodiment will hereinafter be described with reference to FIGS. 1 and 2.

Figure 1A:
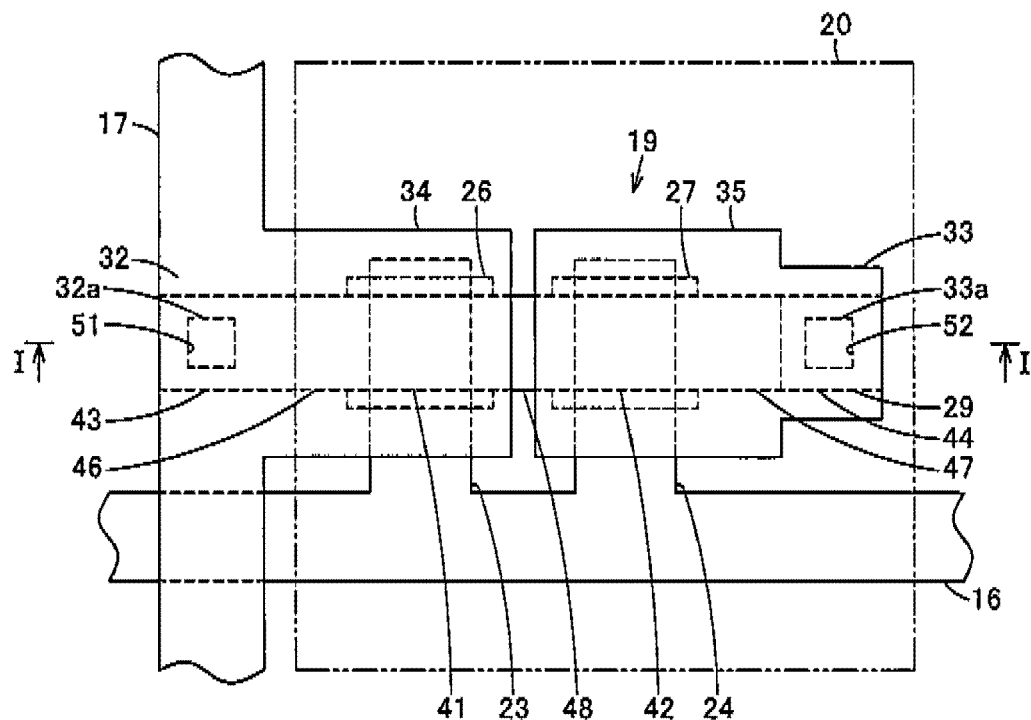
FIGS. 1A and 1B show a thin film semiconductor device according to a first embodiment, FIG. 1A being a plan view thereof and FIG. 1B being a cross-sectional view taken along the line I-I in FIG. 1A.
Figure 1B:
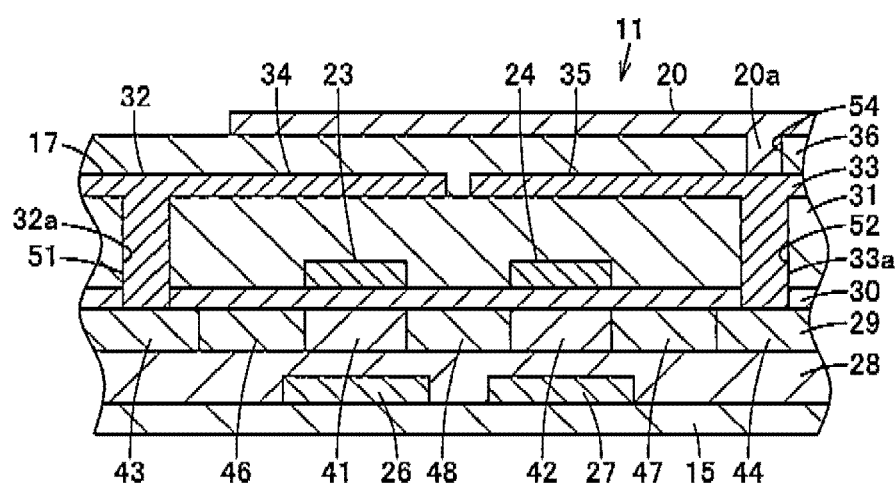

In FIG. 1, the reference numeral 11 denotes an array substrate serving as a substrate device. The array substrate 11 is disposed in a manner opposed to a counter substrate not shown to be used in a liquid crystal display device main body (LCD panel) being the display device main body of a liquid crystal display device 13 (FIG. 2) serving as, for example, an active matrix type display device that can support color display.

The array substrate 11 has a glass substrate 15 being a first substrate main body serving as, for example, a transmissive substrate (insulating substrate) and, on a principal surface of the glass substrate 15 closer to the counter substrate, a scanning line (gate interconnection) 16 and a signal line (source interconnection) 17 being multiple interconnections formed of a conductor such as a metal member in a thin film are formed in a mutually insulated and sterically intersecting manner. In addition, an auxiliary capacitive line not shown is formed parallel with the scanning line 16 and, at the intersection between the scanning line 16 and the signal line 17, a thin film transistor 19 serving as a thin film semiconductor device for pixel driving being a switching element and a pixel electrode 20 to be driven by the thin film transistor 19 to display an image are provided, and an orientation film not shown is provided in a manner covering the thin film transistor 19 and the pixel electrode 20. It is noted that the vertical direction in the following description is based on FIG. 1.

The scanning line 16 and the signal line 17 are electrically connected with a drive circuit mounted on, for example, a flexible printed circuit board that is electrically connected with the array substrate 11, though not shown. The drive circuit is electrically connected with an external signal source and a voltage source not shown.

The thin film transistor 19 is, for example, a top-gated n-channel type one and, in this embodiment, has a double-gate (multi-gate) structure in which a pair of gate electrodes 23 and 24 are provided. The thin film transistor 19 then includes a pair of first light-blocking electrodes 26 and 27 formed on the glass substrate 15 correspondingly to the gate electrodes 23 and 24, an undercoat (UC) insulating film 28 formed on the glass substrate 15 in a manner covering the first light-blocking electrodes 26 and 27, a semiconductor layer 29 formed on the undercoat insulating film 28, a gate insulating film 30 formed on the undercoat insulating film 28 in a manner covering the semiconductor layer 29, the gate electrodes 23 and 24 formed on the gate insulating film 30, a first interlayer insulating film 31 formed on the gate insulating film 30 in a manner covering the gate electrodes 23 and 24, and a source electrode 32 being (one) contact electrode integral with the signal line 17, a drain electrode 33 being (the other) contact electrode electrically connected with the pixel electrode 20, and a pair of second light-blocking electrodes 34 and 35, the source electrode 32, the drain electrode 33, and the pair of second light-blocking electrodes 34 and 35 being formed on the first interlayer insulating film 31. A second interlayer insulating film 36 is formed on the first interlayer insulating film 31 in a manner covering the electrodes 32, 33, 34, and 35, and the pixel electrode 20 is formed on the second interlayer insulating film 36. The thin film transistor 19 then undergoes switching control when a signal from the drive circuit is applied via the scanning line 16 to the gate electrodes 23 and 24 and, by driving the pixel electrode 20 according to a signal voltage applied from the drive circuit via the signal line 17, it is possible to independently turn on/off the pixels (secondary pixels).

The gate electrodes 23 and 24 are formed of a conductive member of, for example, molybdenum/tungsten (MoW) alloy integrally with the scanning line 16 and provided in a protruding manner parallel with each other along the direction intersecting with (orthogonal to) the scanning line 16, that is, parallel with the signal line 17. In other words, the gate electrodes 23 and 24 are formed of the same material and in the same process as the scanning line 16 through patterning during the formation of the scanning line 16. Accordingly, the gate electrodes 23 and 24 are electrically connected (conductive) to each other and set at the same potential as the scanning line 16. Thus having a double-gate structure, the gate electrodes 23 and 24 are allowed to have a certain length and relax the drain electric field to reduce the thermal leakage current.

The first light-blocking electrodes 26 and 27 are formed of a conductive non-transmissive member (light-blocking (reflecting) member) of, for example, metal and positioned below the semiconductor layer 29 just under the respective gate electrodes 23 and 24. The first light-blocking electrodes 26 and 27 are each formed to have a width greater than that of the gate electrodes 23 and 24 in a mutually spaced quadrilateral island shape.

The semiconductor layer 29 is formed of low-temperature polysilicon (LTPS) in an elongated island shape along the direction approximately parallel with the scanning line 16, that is, intersecting with (orthogonal to) the signal line 17, integrally including a pair of channel regions 41 and 42, a pair of contact regions 43 and 44 formed with the pair of channel regions 41 and 42 therebetween, and (first to third) intermediate regions 46, 47, and 48 formed between the channel regions 41 and 42 and the contact regions 43 and 44 as well as between the channel regions 41 and 42.

The channel regions 41 and 42 are positioned under the respective gate electrodes 23 and 24 with the gate insulating film 30 therebetween in a manner opposed to the respective gate electrodes 23 and 24. That is, the channel regions 41 and 42 are self-aligned with the respective gate electrodes 23 and 24 in a mutually spaced manner and each have a width approximately equal to that of the gate electrodes 23 and 24. Accordingly, the channel regions 41 and 42 are narrower than the respective first light-blocking electrodes 26 and 27 (the first light-blocking electrodes 26 and 27 are wider than the respective channel regions 41 and 42), so that the first light-blocking electrodes 26 and 27 prevent incidence of direct and/or indirect light from, for example, a lower (dorsal) backlight.

The contact regions 43 and 44 are doped with an impurity such as phosphorus (P) (n-type impurity) at a concentration relatively higher than in the channel regions 41 and 42 and electrically connected with a source electrode 32 and a drain electrode 33 to serve as a source region and a drain region.

The intermediate regions 46, 47, and 48 are so-called LDD (Lightly Doped Drain) regions doped with an impurity (n-type impurity) at a concentration relatively lower than in the contact regions 43 and 44, and disposed at positions not opposed to (offset from) the gate electrodes 23 and 24 to relax the drain electric field to reduce the thermal leakage current of the thin film transistor 19.

The source electrode 32 and the drain electrode 33 are formed of the same material and in the same process as the signal line 17 through patterning during the formation of the signal line 17, the source electrode 32 being integral with the signal line 17 and the drain electrode 33 being electrically insulated from the source electrode 32. The source electrode 32 and the drain electrode 33 are then provided, respectively, with (one and the other) contact portions 32a and 33a protruding downward, that is, toward the semiconductor layer 29 and fitted, respectively, in (one and the other) contact holes 51 and 52 that are formed through the first interlayer insulating film 31 and the gate insulating film 30 and, via the contact portions 32a and 33a, electrically connected with the respective contact regions 43 and 44.

The second light-blocking electrodes 34 and 35 are provided above the channel regions 41 and 42 in a manner covering the channel regions 41 and 42 to block, for example, direct and/or reflected (indirect) light from above (on the display side) so as to block the entry of light to the channel regions 41 and 42. The second light-blocking electrodes 34 and 35 are formed of a conductive non-transmissive member (light-blocking (reflecting) member) of, for example, metal and positioned immediately above the respective gate electrodes 23 and 24 in a mutually spaced manner. That is, the second light-blocking electrodes 34 and 35 are formed opposite to the semiconductor layer 29 with respect to the gate electrodes 23 and 24. Further, the second light-blocking electrodes 34 and 35 are each formed to have a width greater than those of the gate electrodes 23 and 24, the first light-blocking electrodes 26 and 27, and the channel regions 41 and 42 in a mutually spaced island shape. In this embodiment, the second light-blocking electrodes 34 and 35 are then arranged such that the second light-blocking electrode 34 is formed integrally with the signal line 17, while the other second light-blocking electrode 35 is formed integrally with the drain electrode 33 and electrically connected with the pixel electrode 20. Accordingly, the second light-blocking electrode 34 is formed of the same material and in the same process as the signal line 17 through patterning during the formation of the signal line 17, while the other second light-blocking electrode 35 is patterned at the same time as the drain electrode 33 so as to be formed of the same material and in the same process integrally as the drain electrode 33. As a result, the second light-blocking electrode 34 is set at the same potential as the signal line 17, while the other second light-blocking electrode 35 is set at the same potential as the drain electrode 33 and the pixel electrode 20.

The pixel electrode 20 is formed of a transparent conductive member of, for example, ITO or IZO in an island shape. The pixel electrode 20 has an approximately quadrilateral shape and is disposed at a position spaced laterally from the signal line 17 (source electrode 32) in a manner covering a portion of the scanning line 16, a portion of the auxiliary capacitive line, the gate electrodes 23 and 24, the portion of the semiconductor layer 29 excluding the contact region 43, the first light-blocking electrodes 26 and 27, a portion of the second light-blocking electrode 34, the other second light-blocking electrode 35, and the drain electrode 33. The pixel electrode 20 is then provided with a contact portion 20a protruding downward, that is, toward the drain electrode 33 and fitted in a contact hole 54 that is formed through the second interlayer insulating film 36 and, via the contact portion 20a, electrically connected with the drain electrode 33 to be set at the same potential as the drain electrode 33 and the other second light-blocking electrode 35. Between the pixel electrode 20 (drain electrode 33) and the auxiliary capacitive line, for example, a storage capacitor 56 (FIG. 2) is also formed to redistribute the potential and thereby determine a voltage to be applied to the pixel electrode 20.

In the counter substrate, a color filter layer, a counter electrode being a common electrode common to all pixels, and an orientation film, etc., are laminated in this order on a glass substrate being a transmissive second substrate main body. The counter electrode, which is opposed to all of the pixel electrodes 20 to form electric fields with the pixel electrodes 20, may be formed on the array substrate 11 depending on the mode of the liquid crystal layer. The color filter layer may also be formed on the array substrate 11.

Figure 2:
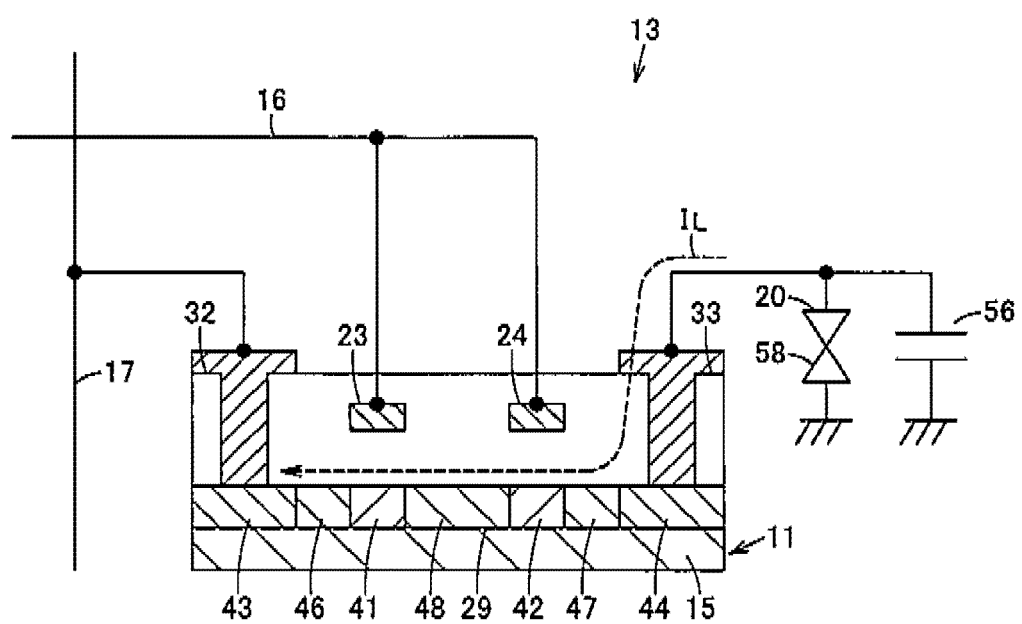
FIG. 2 is an illustrative view schematically and partially showing a circuit of a display device including the thin film semiconductor device.

The liquid crystal display device 13 shown in FIG. 2 is then arranged such that a counter substrate not shown is disposed in a manner opposed to the array substrate 11 with a predetermined gap (cell gap) therebetween and, between the array substrate 11 and the counter substrate, there are provided a liquid crystal layer 58 being an optical modulation layer that has a capacitance electrically parallel with the storage capacitor 56 and a spacer not shown arranged to maintain the clearance, and the array substrate 11 and the counter substrate are bonded to each other with a sealing portion therebetween, and that a polarizing plate is mounted on each of the array substrate 11 and the counter substrate and multiple pixels to be driven by the thin film transistor 19 are arranged in a matrix so that an active area, that is, a display region on which an image can be displayed is formed in a quadrilateral shape.

The liquid crystal layer 58 has liquid crystal molecules to undergo switching driven by a vertical electric field, a horizontal electric field, or an oblique electric field that is formed between each pixel electrode 20 and each counter electrode.

As shown in FIGS. 1 and 2, the thin film transistor 19 is then arranged such that the first light-blocking electrodes 26 and 27 block light from the backlight if the liquid crystal display device 13 is of, for example, transmissive, semi-transmissive, or reflection/transmission combined type or direct and/or indirect light from below (on the dorsal side) if the liquid crystal display device 13 is of reflective type to block entry to the channel regions 41 and 42 of the semiconductor layer 29, while the second light-blocking electrodes 34 and 35 block direct light from above (on the display side) and/or reflected (indirect) part of light from the backlight to block entry to the channel regions 41 and 42 of the semiconductor layer 29 to reduce the drain current of the thin film transistor 19, which may be increased through photoelectric conversion when the channel regions 41 and 42 absorb light, and particularly the leakage current (optical leakage current) being the drain current when the thin film transistor 19 is off.

Further, the second light-blocking electrodes 34 and 35, which are electrically connected with the signal line 17 and the pixel electrode 20, can relax the electric field in end portions of the gate electrodes 23 and 24 to reduce the thermal leakage current.

Thus, the first light-blocking electrodes 26 and 27 and the second light-blocking electrodes 34 and 35, which are formed under and above the channel regions 41 and 42 in a manner covering the channel regions 41 and 42, can block the entry of light to the channel regions 41 and 42 to reduce the optical leakage current due to incidence of light into the channel regions 41 and 42. In addition, since the second light-blocking electrode 34 is electrically connected with the signal line 17, while the other second light-blocking electrode 35 is electrically connected with the pixel electrode 20, it is possible to relax the electric field in the end portions of the gate electrodes 23 and 24, which are backed up vertically by the first light-blocking electrodes 26 and 27 and the second light-blocking electrodes 34 and 35, and thereby to reduce the thermal leakage current. It is therefore possible to reduce the leakage current $I_L$ of the thin film transistor 19.

Figure 3A:
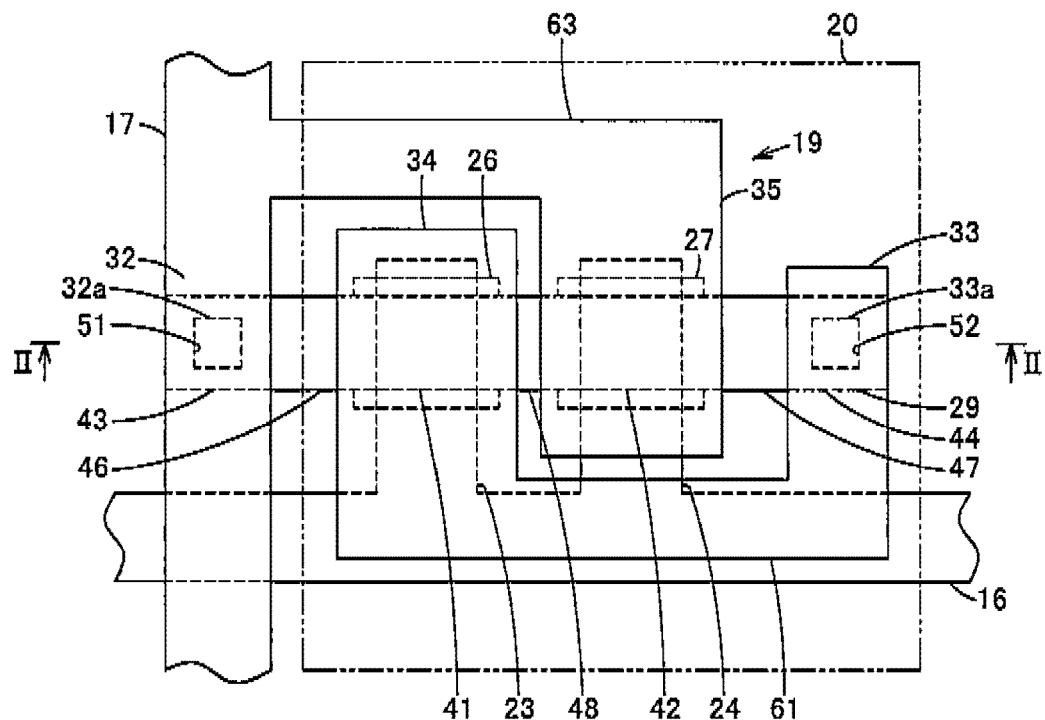
FIGS. 3A and 3B show a thin film semiconductor device according to a second embodiment, FIG. 3A being a plan view thereof and FIG. 3B being a cross-sectional view taken along the line II-II in FIG. 3A.
Figure 3B:
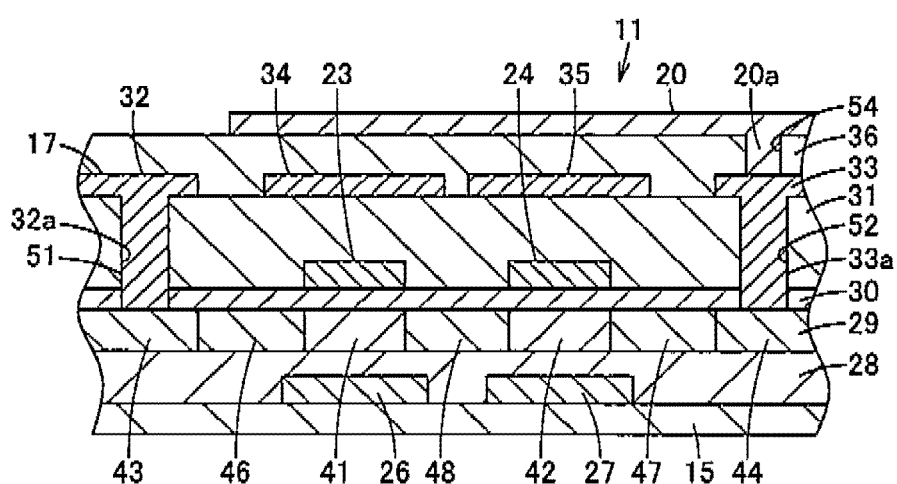

Next will be described a second embodiment with reference to FIG. 3. It is noted that arrangements and operations identical to those in the first embodiment are designated by the same reference numerals to omit description thereof.

In the second embodiment, the second light-blocking electrode 34 in the first embodiment is electrically connected with the pixel electrode 20, while the other second light-blocking electrode 35 is electrically connected with the signal line 17.

The second light-blocking electrode 34 is electrically connected with the drain electrode 33 through, for example, (one) connecting portion 61 formed on and along the scanning line 16 and, via the drain electrode 33, electrically connected with the pixel electrode 20. That is, the second light-blocking electrode 34 is patterned at the same time as the drain electrode 33 so as to be formed of the same material and in the same process integrally as the drain electrode 33 (and the connecting portion 61). As a result, the second light-blocking electrode 34 is set at the same potential as the drain electrode 33 and the pixel electrode 20.

Also, the other second light-blocking electrode 35 is electrically connected with the signal line 17 through, for example, (the other) connecting portion 63 formed approximately parallel with the scanning line 16. That is, the other second light-blocking electrode 35 is formed of the same material and in the same process integrally as the signal line 17 through patterning during the formation of the signal line 17. As a result, the other second light-blocking electrode 35 is set at the same potential as the signal line 17.

The first light-blocking electrodes 26 and 27 and the second light-blocking electrodes 34 and 35, which are formed under and above the channel regions 41 and 42 in a manner covering the channel regions 41 and 42, can then block entry of light to the channel regions 41 and 42 to reduce the optical leakage current due to incidence of light into the channel regions 41 and 42. In addition, since the second light-blocking electrode 34 is electrically connected with the pixel electrode 20, while the other second light-blocking electrode 35 is electrically connected with the signal line 17, the potential of the intermediate region 47 closer to the pixel electrode 20 decreases when the potential of the pixel electrode 20 is higher than the potential of the signal line 17. It is thus possible to relax the electric field in the end portions of the gate electrodes 23 and 24, which are backed up vertically by the first light-blocking electrodes 26 and 27 and the second light-blocking electrodes 34 and 35, and thereby to reduce the thermal leakage current. It is therefore possible to reduce the leakage current $I_L$ of the thin film transistor 19.

Figure 4A:
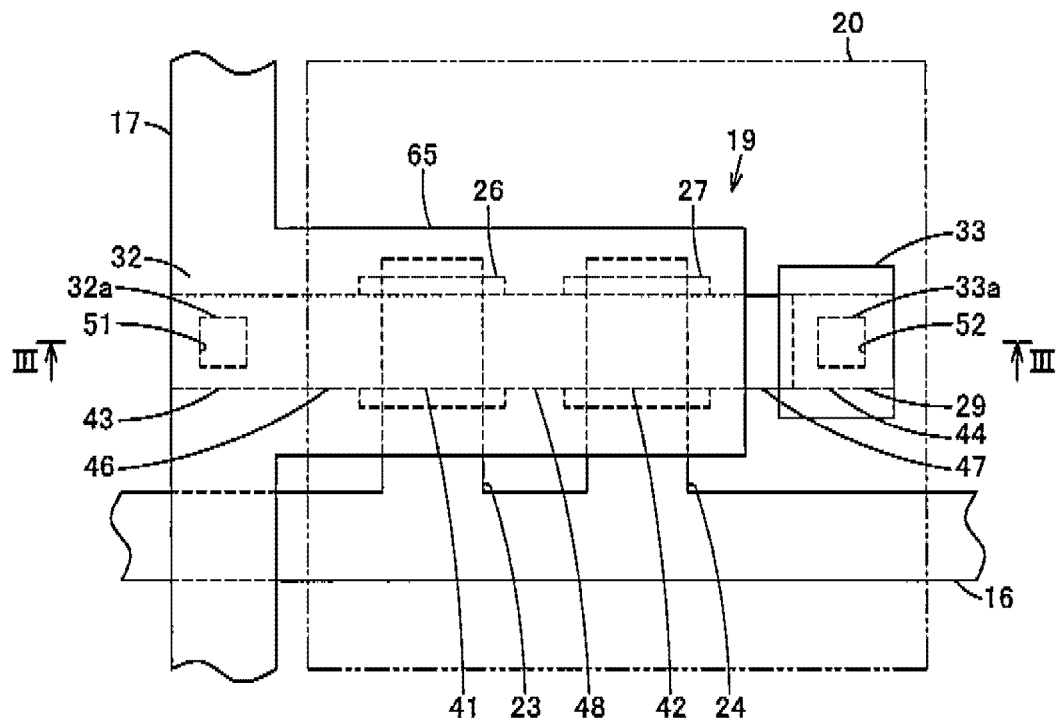
FIGS. 4A and 4B show a thin film semiconductor device according to a third embodiment, FIG. 4A being a plan view thereof and FIG. 4B being a cross-sectional view taken along the line in FIG. 4A.
Figure 4B:
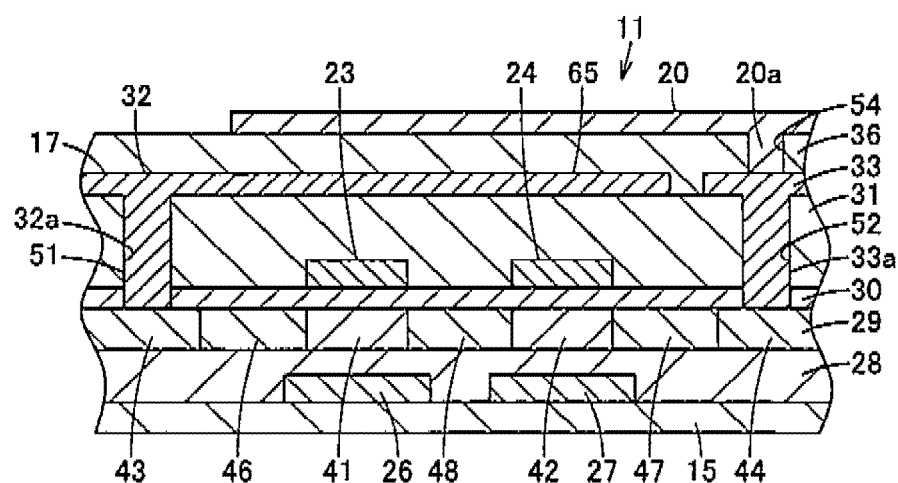

Next will be described a third embodiment with reference to FIG. 4. It is noted that arrangements and operations identical to those in the above-described embodiments are designated by the same reference numerals to omit description thereof.

In the third embodiment, instead of the second light-blocking electrodes 34 and 35 in the above-described embodiments, a single second light-blocking electrode 65 is formed in a manner opposed to both the gate electrodes 23 and 24.

In this embodiment, the second light-blocking electrode 65 is formed integrally with and electrically connected with the signal line 17. That is, the second light-blocking electrode 65 is formed of the same material and in the same process integrally as the signal line 17 through patterning during the formation of the signal line 17. As a result, the second light-blocking electrode 65 is set at the same potential as the signal line 17, and also covers the channel regions 41 and 42 from above to block entry of light to the channel regions 41 and 42.

The first light-blocking electrodes 26 and 27 and the second light-blocking electrode 65, which are formed under and above the channel regions 41 and 42 in a manner covering the channel regions 41 and 42, can then block entry of light to the channel regions 41 and 42 to reduce the optical leakage current due to incidence of light into the channel regions 41 and 42. In addition, since the second light-blocking electrode 65, which is formed over the two channel regions 41 and 42 (gate electrodes 23 and 24), is electrically connected with the signal line 17, it is possible to relax the electric field in the end portions of the gate electrodes 23 and 24, which are backed up vertically by the first light-blocking electrodes 26 and 27 and the second light-blocking electrode 65, and thereby to reduce the thermal leakage current. It is therefore possible to reduce the leakage current $I_L$ of the thin film transistor 19.

Figure 5A:
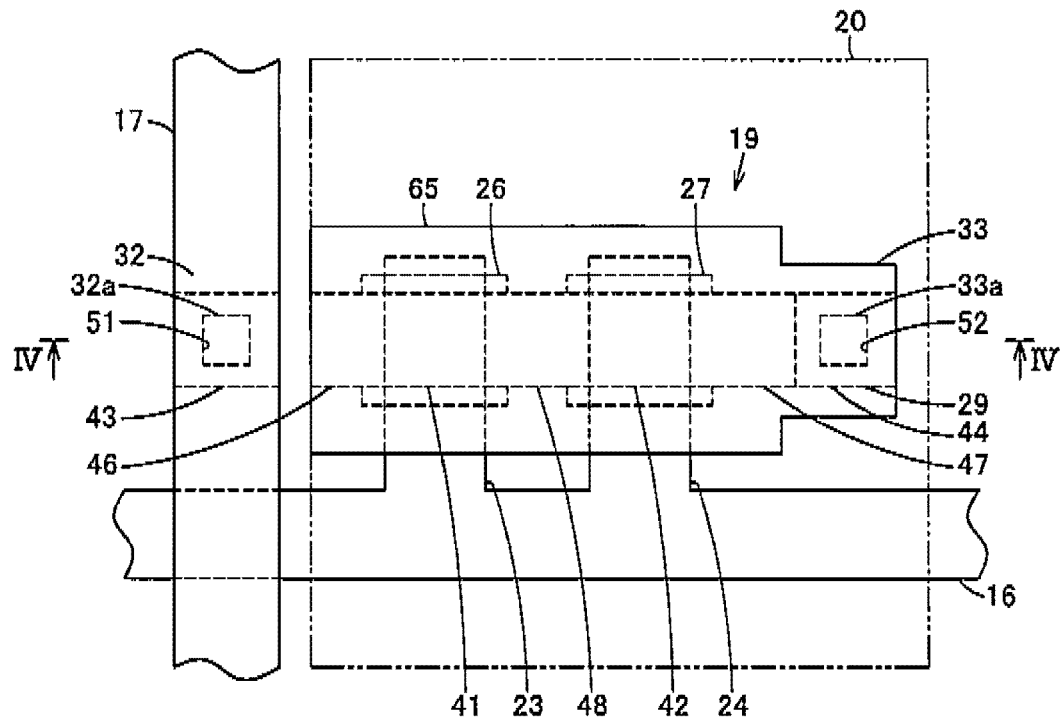
FIGS. 5A and 5B show a thin film semiconductor device according to a fourth embodiment, FIG. 5A being a plan view thereof and FIG. 5B being a cross-sectional view taken along the line IV-IV in FIG. 5A.
Figure 5B:
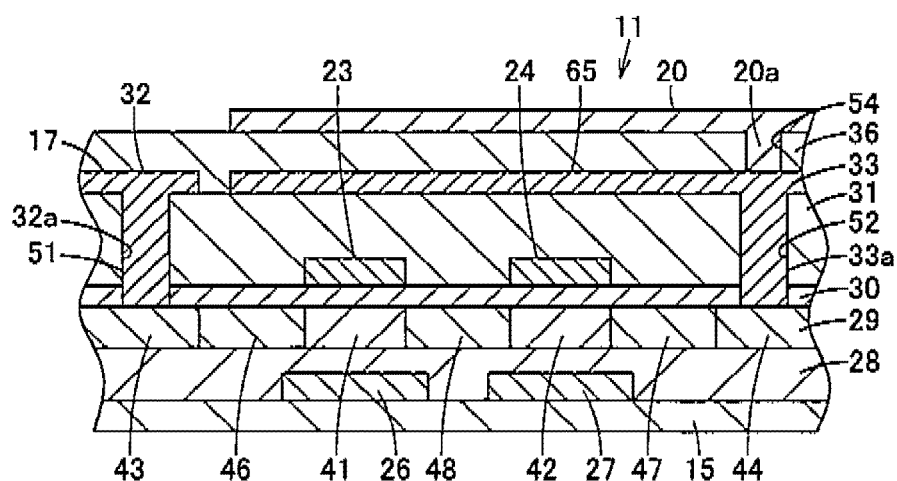

Next will be described a fourth embodiment with reference to FIG. 5. It is noted that arrangements and operations identical to those in the above-described embodiments are designated by the same reference numerals to omit description thereof.

In the fourth embodiment, a single second light-blocking electrode 65 formed in a manner opposed to both the gate electrodes 23 and 24 is electrically connected with the pixel electrode 20 via the drain electrode 33, as is the case in the third embodiment.

That is, the second light-blocking electrode 65 is patterned at the same time as the drain electrode 33 so as to be formed of the same material and in the same process integrally as the drain electrode 33 (and the connecting portion 61). As a result, the second light-blocking electrode 65 is set at the same potential as the drain electrode 33 and the pixel electrode 20.

The first light-blocking electrodes 26 and 27 and the second light-blocking electrode 65, which are formed under and above the channel regions 41 and 42 in a manner covering the channel regions 41 and 42, can then block entry of light to the channel regions 41 and 42 to reduce the optical leakage current due to incidence of light into the channel regions 41 and 42. In addition, since the second light-blocking electrode 65, which is formed above the two channel regions 41 and 42 (gate electrodes 23 and 24), is electrically connected with the pixel electrode 20, it is possible to relax the electric field in the end portions of the gate electrodes 23 and 24, which are backed up vertically by the first light-blocking electrodes 26 and 27 and the second light-blocking electrode 65, and thereby to reduce the thermal leakage current. It is therefore possible to reduce the leakage current $I_L$ of the thin film transistor 19.

Figure 6A:
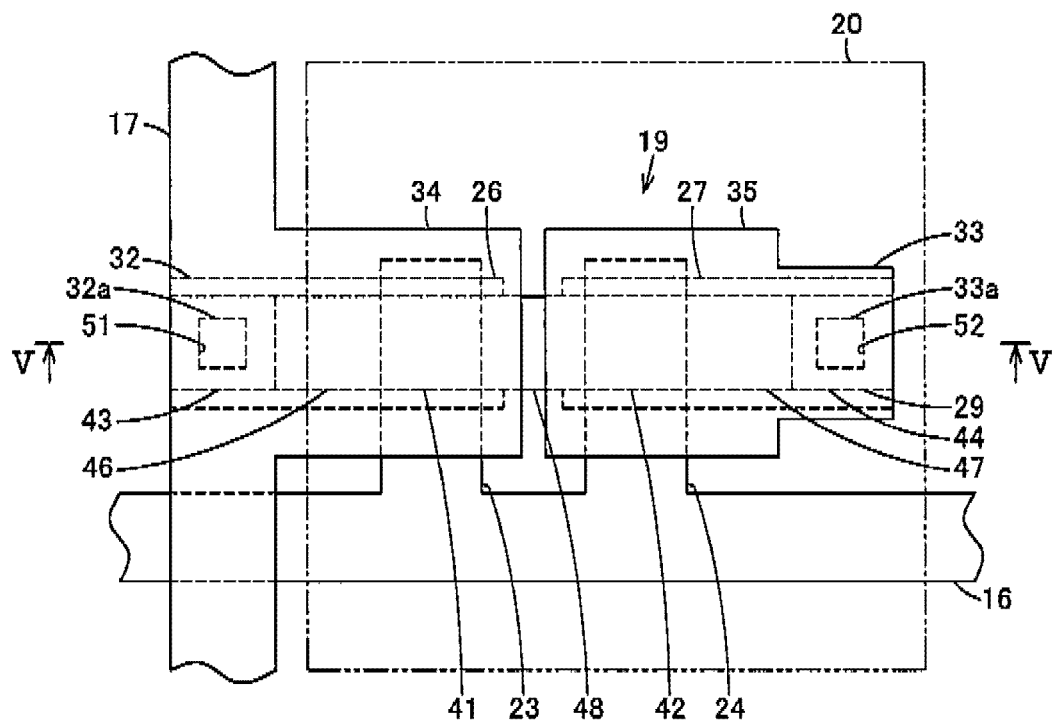
FIGS. 6A and 6B show a thin film semiconductor device according to a fifth embodiment, FIG. 6A being a plan view thereof and FIG. 6B being a cross-sectional view taken along the line V-V in FIG. 6A.
Figure 6B:
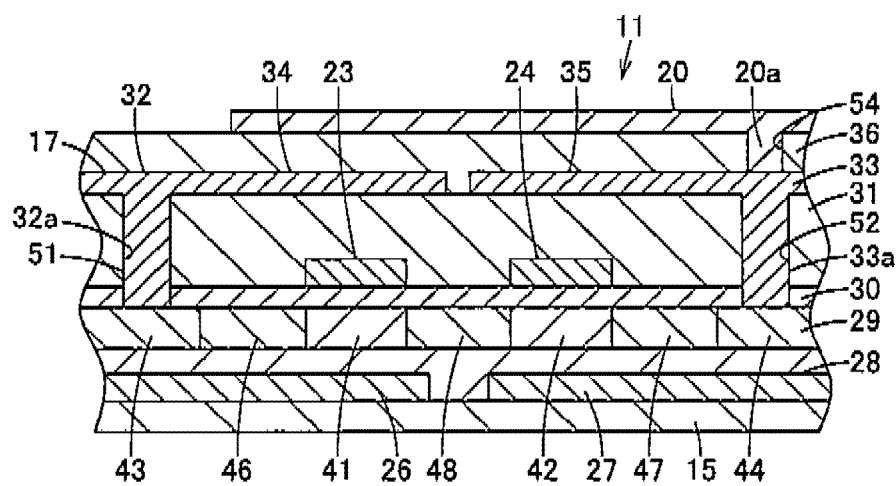

Next will be described a fifth embodiment with reference to FIG. 6. It is noted that arrangements and operations identical to those in the above-described embodiments are designated by the same reference numerals to omit description thereof.

In the fifth embodiment, the first light-blocking electrodes 26 and 27 in the first embodiment extend to positions opposed to the respective contact regions 43 and 44.

That is, the first light-blocking electrode 26 is formed in an elongated manner from under the intermediate region 48 through the channel region 41 and the intermediate region 46 to the contact region 43 and opposed approximately parallel to the contact region 43 with the undercoat insulating film 28 therebetween, so that the first light-blocking electrode 26 and the contact region 43 are capacitively coupled.

Similarly, the other first light-blocking electrode 27 is formed in an elongated manner from under the intermediate region 48 through the other channel region 42 and the intermediate region 47 to the other contact region 44 and opposed approximately parallel to the other contact region 44 with the undercoat insulating film 28 therebetween, so that the other first light-blocking electrode 27 and the other contact region 44 are capacitively coupled.

Accordingly, the fluctuation in the potential of the first light-blocking electrodes 26 and 27 is reduced, which makes it possible to relax the electric field in the end portions of the gate electrodes 23 and 24 more reliably and thereby to reduce the thermal leakage current. It is therefore possible to reduce the leakage current $I_L$ of the thin film transistor 19.

Figure 7A:
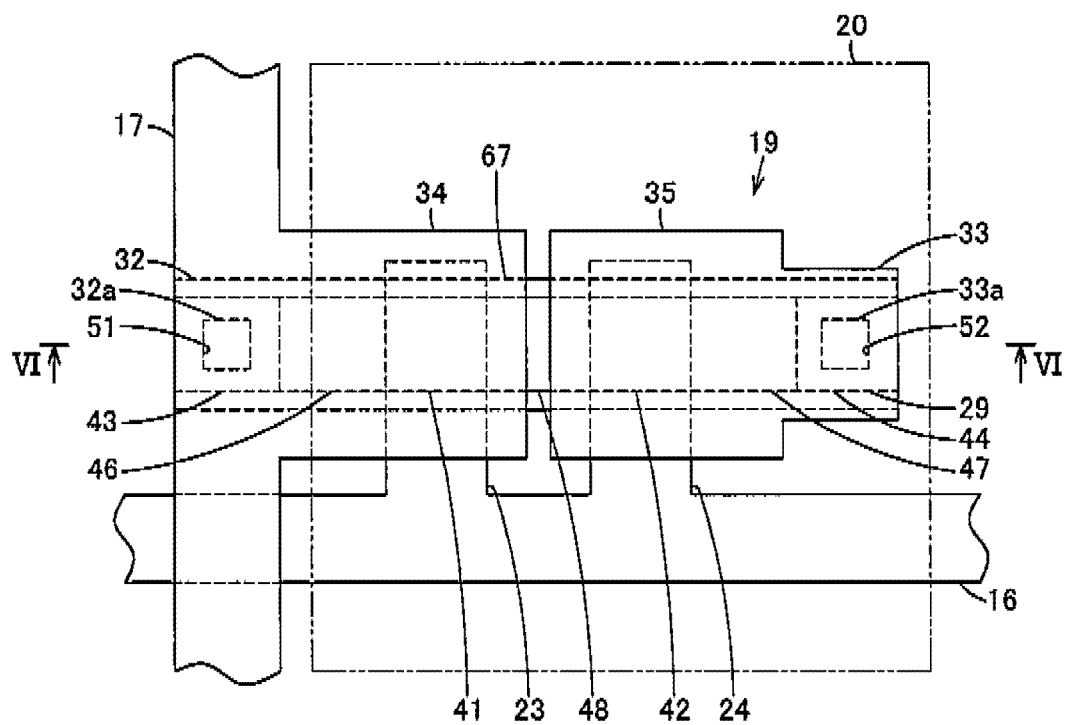
FIGS. 7A and 7B show a thin film semiconductor device according to a sixth embodiment, FIG. 7A being a plan view thereof and FIG. 7B being a cross-sectional view taken along the line VI-VI in FIG. 7A.
Figure 7B:
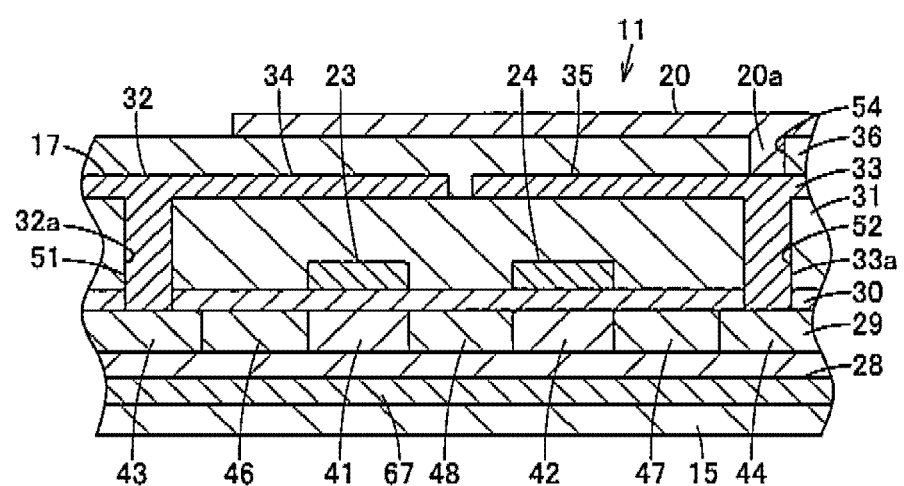

Next will be described a sixth embodiment with reference to FIG. 7. It is noted that arrangements and operations identical to those in the above-described embodiments are designated by the same reference numerals to omit description thereof.

In the sixth embodiment, instead of the first light-blocking electrodes 26 and 27 in the fifth embodiment, a single first light-blocking electrode 67 is formed in a manner opposed to both the gate electrodes 23 and 24 and extends to positions opposed to both the contact regions 43 and 44.

That is, the first light-blocking electrode 67 is formed of a conductive non-transmissive member (light-blocking (reflecting) member) of, for example, metal and positioned below the semiconductor layer 29 just under the respective gate electrodes 23 and 24. The first light-blocking electrode 67 is formed to have a width greater than that of the gate electrodes 23 and 24 in an elongated quadrilateral island shape approximately parallel with the scanning line 16. That is, the first light-blocking electrode 67 is formed in an elongated manner from under the contact region 43 through the intermediate region 46, the channel region 41, the intermediate region 48, the other channel region 42, and the intermediate region 47 to the other contact region 44 and opposed approximately parallel to the contact regions 43 and 44 with the undercoat insulating film 28 therebetween, so that the first light-blocking electrode 67 and the contact regions 43 and 44 are capacitively coupled.

As a result, the first light-blocking electrode 67 is set at an intermediate potential between the potential of the signal line 17 and the potential of the pixel electrode 20, and the fluctuation in the potential of the first light-blocking electrode 67 is reduced, which makes it possible to relax the electric field in the end portions of the gate electrodes 23 and 24 more reliably and thereby to reduce the thermal leakage current. It is therefore possible to reduce the leakage current $I_L$ of the thin film transistor 19.

In addition, since the first light-blocking electrode 67 is formed as a unit without being split into a portion opposed to the channel region 41 and a portion opposed to the other channel region 42, it is possible to block the entry of light to the channel regions 41 and 42 more reliably to reduce the optical leakage current due to incidence of light into the channel regions 41 and 42 more reliably.

It is noted that the arrangement according to the second embodiment may be applied to the fifth and sixth embodiments.

Further, the thin film transistor 19, which, in the above-described embodiments, has a double-gate structure in which the pair of gate electrodes 23 and 24 are provided, may have a single-gate structure in which a single gate electrode is provided.

In accordance with at least one of the above-described embodiments, the first light-blocking electrodes 26 and 27 (or the first light-blocking electrode 67) and the second light-blocking electrodes 34 and 35 (or the second light-blocking electrode 65) can block the entry of light to the channel regions 41 and 42 to reduce the optical leakage current of each thin film transistor 19 due to incidence of light into the channel regions 41 and 42.

In addition, since the second light-blocking electrodes 34 and 35 (or the second light-blocking electrode 65) are electrically connected with the signal line 17 or the pixel electrode 20, it is possible to relax the electric field in the end portions of the gate electrodes 23 and 24 and thereby to reduce the thermal leakage current.

It is therefore possible to reduce the leakage current $I_L$ of the thin film transistor 19.

Particularly in recent years, backlights have exhibited higher intensity and optical leakage current has become more likely to flow. Hence, the first light-blocking electrodes 26 and 27 and the second light-blocking electrodes 34 and 35 can reliably block the entry of light to the channel regions 41 and 42 to reduce the optical leakage current.

Further, providing the pair of gate electrodes 23 and 24 allows the gate electrodes to have a certain length and thereby the thermal leakage current to be reduced more effectively.

Similarly, providing the intermediate regions 46, 47, and 48 being LDD regions adjacent to the channel regions 41 and 42 allows the drain electric field to be relaxed and thereby the thermal leakage current to be reduced more effectively.

As a result, in the liquid crystal display device 13, for example, even if each thin film transistor 19 may be driven intermittently at low frequency for lower power consumption when displaying a still image, the off-state leakage current $I_L$ can be reduced and the decrease in the potential of the pixel electrode 20 due to the leakage current $I_L$ can be made less likely to appear as flickering, whereby it is possible for the liquid crystal display device 13 to ensure a good display quality.

While certain embodiments of the present invention have heretofore been described, these embodiments have been presented by way of example only and are not intended to limit the scope of the invention. Indeed, the novel embodiments described herein may be embodied in a variety of other forms; furthermore, various omissions, substitutions, and variations may be made without departing from the spirit of the invention. The appended claims and their equivalents are intended to cover these embodiments and their modifications as would fall within the scope and spirit of the invention.

What is claimed is:

1. A thin film semiconductor device for use in a display device, the thin film semiconductor device arranged to drive a pixel electrode, with which an image is displayed, according to a signal voltage applied on a signal line, the thin film semiconductor device comprising:
   a semiconductor layer including a channel region and a pair of contact regions disposed with the channel region therebetween and doped with an impurity at a concentration relatively higher than in the channel region, wherein one of the contact regions is electrically connected to the signal line, while the other is electrically connected to the pixel electrode;
   a gate electrode disposed at a position facing the channel region of the semiconductor layer; and
   a light-blocking electrode arranged to block light incident into the channel region, wherein
   the light-blocking electrode consists of:
   a first light-blocking electrode disposed opposite to the gate electrode with respect to the semiconductor layer and facing the channel region to block light incident into the channel region; and
   a second light-blocking electrode disposed opposite to the semiconductor layer with respect to the gate electrode, arranged to block light incident into the channel region, and electrically connected with one of the signal line and the pixel electrode, and wherein
   the gate electrode is formed in a pair, the pair of gate electrodes electrically connected to each other, and wherein
   the channel region and the second light-blocking electrode are each formed in a pair correspondingly to the pair of gate electrodes, and wherein
   one of the pair of second light-blocking electrodes is electrically connected with the signal line, while the other electrically connected with the pixel electrode.

2. The thin film semiconductor device according to claim 1, wherein the first light-blocking electrode is formed in a pair correspondingly to the pair of gate electrodes, the pair of first light-blocking electrodes extending to positions facing the pair of respective contact regions.

3. The thin film semiconductor device according to claim 1, wherein the first light-blocking electrode is formed in a manner facing both of the pair of gate electrodes and extends to positions facing the pair of respective contact regions.

4. The thin film semiconductor device according to claim 1, wherein
   the channel region and the first light-blocking electrode are each formed in a pair correspondingly to the pair of gate electrodes, and wherein the second light-blocking electrode is formed in a manner facing both of the pair of channel regions and electrically connected with one of the signal line and the pixel electrode.

5. The thin film semiconductor device according to claim 1, further comprising an intermediate region positioned between the channel region and each of the contact regions.

* * * * *